(12) United States Patent
Yoon et al.

(10) Patent No.: US 10,074,560 B2
(45) Date of Patent: Sep. 11, 2018

(54) METHOD OF MANUFACTURING SEMICONDUCTOR DEVICE

(71) Applicants: Ki-hyun Yoon, Hwaseong-si (KR); Hauk Han, Hwaseong-si (KR); Yeon-sil Sohn, Yongin-si (KR); Seul-gi Bae, Yeosu-si (KR); Hyun-seok Lim, Suwon-si (KR)

(72) Inventors: Ki-hyun Yoon, Hwaseong-si (KR); Hauk Han, Hwaseong-si (KR); Yeon-sil Sohn, Yongin-si (KR); Seul-gi Bae, Yeosu-si (KR); Hyun-seok Lim, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 15/601,045

(22) Filed: May 22, 2017

(65) Prior Publication Data

US 2018/0090325 A1   Mar. 29, 2018

(30) Foreign Application Priority Data

Sep. 23, 2016 (KR) .................. 10-2016-0122378

(51) Int. Cl.
*H01L 21/768* (2006.01)
*H01L 21/28* (2006.01)
(Continued)

(52) U.S. Cl.
CPC .. *H01L 21/76841* (2013.01); *H01L 21/28088* (2013.01); *H01L 21/8221* (2013.01); *H01L 21/8239* (2013.01); *H01L 27/1052* (2013.01); *H01L 27/11551* (2013.01); *H01L 27/11556* (2013.01); *H01L 27/11568* (2013.01);
(Continued)

(58) Field of Classification Search
CPC ............. H01L 21/8221; H01L 21/8239; H01L 27/1052; H01L 27/1128; H01L 27/11536; H01L 27/11568; H01L 27/11578; H01L 27/1158; H01L 27/11582; H01L 27/2481;
(Continued)

(56) References Cited

U.S. PATENT DOCUMENTS 7,259,096 B2   8/2007   Kim
7,344,974 B2   3/2008   Kim
(Continued)

FOREIGN PATENT DOCUMENTS

JP           11-265934 A      9/1999
KR     10-1997-0018086        4/1997
(Continued)

*Primary Examiner* — Eduardo A Rodela
(74) *Attorney, Agent, or Firm* — Harness, Dickey & Pierce, P.L.C.

(57) ABSTRACT

A method of manufacturing a semiconductor device includes forming an insulating pattern layer on a substrate, conformally forming a first conductive layer with a first thickness on the insulating pattern layer, wet etching the first conductive layer to have a second thickness that is less than the first thickness, and forming a second conductive layer on the first conductive layer after wet etching the first conductive layer. The second conductive layer includes a material that is different from a material included in the first conductive layer.

17 Claims, 21 Drawing Sheets

(51) Int. Cl.
*H01L 29/40* (2006.01)
*H01L 29/66* (2006.01)
*H01L 27/11556* (2017.01)
*H01L 27/11582* (2017.01)
*H01L 27/11578* (2017.01)
*H01L 29/792* (2006.01)
*H01L 21/822* (2006.01)
*H01L 27/11568* (2017.01)
*H01L 21/8239* (2006.01)
*H01L 27/105* (2006.01)
*H01L 27/11551* (2017.01)

(52) U.S. Cl.
CPC .. *H01L 27/11578* (2013.01); *H01L 27/11582* (2013.01); *H01L 29/401* (2013.01); *H01L 29/66477* (2013.01); *H01L 29/792* (2013.01); *H01L 29/7926* (2013.01)

(58) Field of Classification Search
CPC . H01L 27/249; H01L 29/792; H01L 29/7926; H01L 29/8122
See application file for complete search history.

(56) References Cited

U.S. PATENT DOCUMENTS

| | | | |
|---|---|---|---|
| 7,679,133 | B2 | 3/2010 | Son et al. |
| 8,553,466 | B2 | 10/2013 | Han et al. |
| 8,559,235 | B2 | 10/2013 | Yoon et al. |
| 8,654,587 | B2 | 2/2014 | Yoon et al. |
| 9,257,274 | B2 | 2/2016 | Kang et al. |
| 9,390,970 | B2 | 7/2016 | Chiang et al. |
| 9,824,929 | B2 * | 11/2017 | Jangjian ............ H01L 21/28568 |
| 2011/0101539 | A1 * | 5/2011 | Kato .................... H01L 21/6835 257/774 |
| 2011/0233648 | A1 | 9/2011 | Seol et al. |
| 2016/0260734 | A1 * | 9/2016 | Beppu ............... H01L 27/11582 |
| 2017/0243650 | A1 * | 8/2017 | Ogawa .................. G11C 16/08 |
| 2017/0243873 | A1 * | 8/2017 | Kobayashi ........ H01L 29/42364 |
| 2017/0271358 | A1 * | 9/2017 | Mori ................. H01L 27/11582 |

FOREIGN PATENT DOCUMENTS

| | | |
|---|---|---|
| KR | 10-1997-0053067 | 7/1997 |
| KR | 10-0231727 B1 | 11/1999 |
| KR | 10-2002-0009265 A | 2/2002 |

* cited by examiner

METHOD OF MANUFACTURING SEMICONDUCTOR DEVICE

CROSS-REFERENCE TO RELATED APPLICATION

The present application claims priority under 35 U.S.C. § 119 to Korean Patent Application No. 10-2016-0122378, filed on Sep. 23, 2016, in the Korean Intellectual Property Office, the disclosure of which is incorporated herein in its entirety by reference.

BACKGROUND

Inventive concepts relate to a method of manufacturing a semiconductor device, and more particularly, to a method of manufacturing a semiconductor device including a memory device having excellent electrical characteristics.

As electronic devices have become more multifunctional, semiconductor devices including memory devices may have high capacity and high integration. As the size of a memory cell for high capacity and high integration has been reduced, operation circuits included in a memory device and an interconnection structure for operation of the memory device and electrical connection have become complicated. Accordingly, a semiconductor device including a memory device having enhanced integration and excellent electrical characteristics is desired.

SUMMARY

Inventive concepts relate to a method of manufacturing a semiconductor device including a non-volatile vertical memory device having excellent electrical characteristics and high integration.

According to some example embodiments of inventive concepts, a method of manufacturing a semiconductor device includes forming an insulating pattern layer on a substrate; conformally forming a first conductive layer on the insulating pattern layer, the first conductive layer having a first thickness; wet etching the first conductive layer, the wet etching the first conductive layer including reducing a thickness of the first conductive layer from the first thickness to a second thickness that is less than the first thickness; and forming a second conductive layer on the first conductive layer after the wet etching the first conductive layer, the second conductive layer including a material that is different from a material included in the first conductive layer.

According to some example embodiments of inventive concepts, a method of manufacturing a semiconductor device includes forming a semiconductor structure on a substrate, the semiconductor structure extending vertically from an upper surface of a first area of the substrate; conformally forming a gate dielectric layer along a side wall of the semiconductor structure; conformally forming a gate electrode layer on the gate dielectric layer, the gate electrode layer having a first thickness; wet etching the gate electrode layer, the wet etching the gate electrode layer including reducing a thickness of the gate electrode layer to a second thickness that is less than half of the first thickness; forming a gate conductive layer on the gate electrode layer after the wet etching the gate electrode layer, the gate conductive layer including a material different from a material included in the gate electrode layer; and forming a contact electrode on an upper surface of a second area of the substrate, the contact electrode extending vertically from the upper surface of the second area of the substrate.

According to some example embodiments of inventive concepts, a method of manufacturing a semiconductor device includes forming a first conductive layer on a preliminary structure, wet etching the first conductive layer, and forming second conductive layer on the first conductive layer after the wet etching the first conductive layer. The forming the first conductive layer includes conformally forming the first conductive layer in an opening defined by the preliminary structure on a substrate. The first conductive layer has a first thickness. The wet etching the first conductive layer includes reducing a thickness of the first conductive layer from the first thickness to a second thickness that is less than the first thickness. The second conductive layer includes a material that is different from a material included in the first conductive layer.

BRIEF DESCRIPTION OF THE DRAWINGS

Inventive concepts will be more clearly understood from the following detailed description taken in conjunction with the accompanying drawings in which.

DETAILED DESCRIPTION

FIGS. 1 through 6 are cross-sectional views for sequentially describing a method of manufacturing a semiconductor device, according to some example embodiments of inventive concepts.

Figure 1:
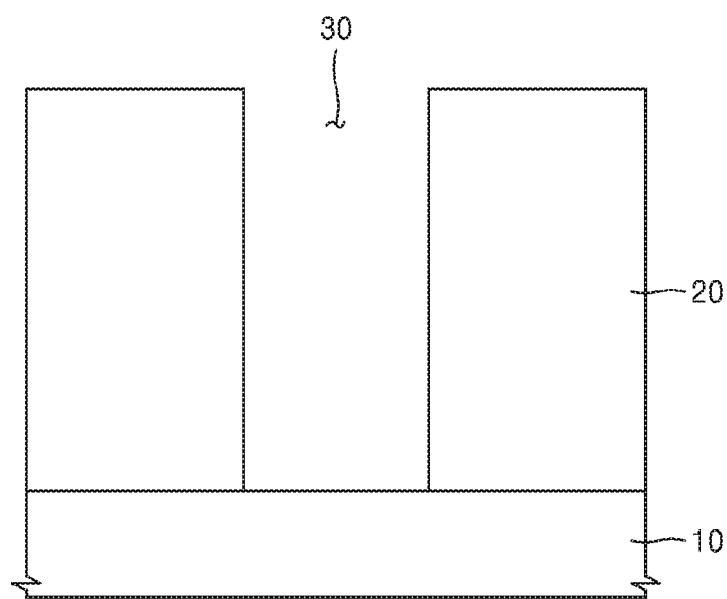
FIGS. 1 through 6 are cross-sectional views for sequentially describing a method of manufacturing a semiconductor device, according to some example embodiments of inventive concepts.

Referring to FIG. 1, after an insulating layer is formed on an upper surface of a substrate 10, a part of the upper surface of the substrate 10 is exposed. A photolithography process and an etching process may be performed by using a mask (not shown). Thus, an insulating pattern layer 20 including a hole pattern 30 may be formed.

The substrate 10 may include a semiconductor or semiconductor-on-insulator. For example, the substrate may include silicon (Si), for example, crystalline silicon (Si), polycrystalline silicon (Si), or amorphous silicon (Si). In some example embodiments, the substrate 10 may include a semiconductor material such as germanium (Ge), silicon germanium (SiGe), silicon carbide (SiC), gallium arsenide (GaAs), indium arsenide (InAs), or indium phosphide (InP). In some example embodiments, the substrate 10 may include a conductive area, for example, an impurity-doped well or an impurity-doped structure.

The insulating pattern layer 20 may include one of a silicon oxide layer, a silicon nitride layer, a silicon oxynitride layer, an oxide/nitride/oxide (ONO) layer, and a high-k dielectric layer having a higher dielectric constant than the silicon oxide layer, or a combination thereof.

The hole pattern 30 may have a high aspect ratio (e.g., an aspect ratio greater than 5). As the semiconductor device has high capacity and high integration, an area of a unit memory device of the semiconductor device may be reduced and/or minimized. To this end, the hole pattern 30 may have a high aspect ratio, for example, an aspect ratio higher than 1:50. The insulating pattern layer 20 and the hole pattern 30 may also be referred to as a preliminary structure and an opening defined by the preliminary structure, respectively.

Figure 2:
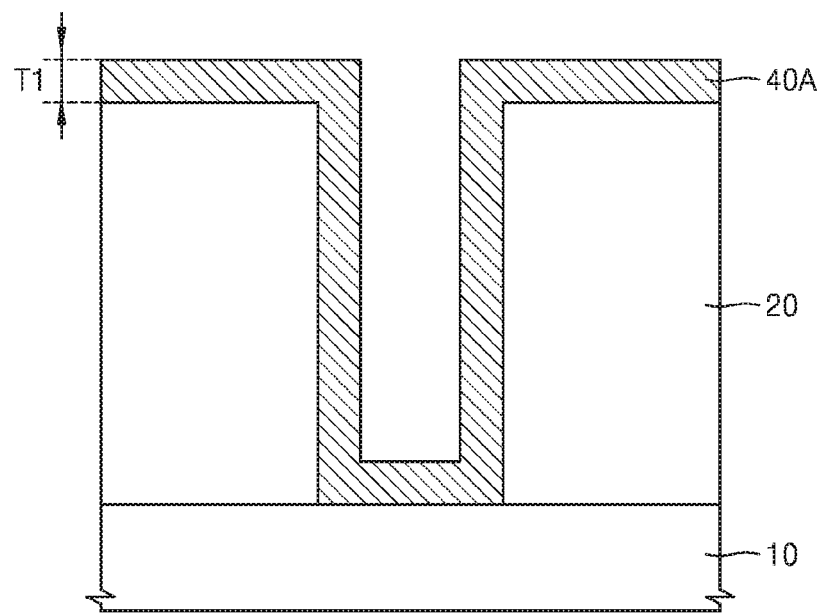

Referring to FIG. 2, a first conductive layer 40A may be conformally formed with a first thickness T1 on an upper surface of the insulating pattern layer 20, an inner surface of the hole pattern 30 (see FIG. 1), and an exposed surface of the substrate 10.

The first conductive layer 40A may include one of TiN, TiON, WN, TaN, AlN, and MoON, or a combination thereof. The first conductive layer 40A may include different materials according to the purpose of use. For example, the first conductive layer 40A may be used as a gate electrode layer, a barrier metal layer, or an anti-diffusion layer and may include different materials in each case.

The first conductive layer 40A may be formed by a chemical vapor deposition (CVD) process, an MOCVD metal organic CVD process, an atomic layer deposition (ALD) process, an MOALD metal organic ALD (MOALD) process, an electroplating process, or a combination thereof, but is not limited thereto. These processes may generally have an excellent step coverage, compared to a physical vapor deposition (PVD) process.

Thus, as described above, to conformally form the first conductive layer 40A substantially having the first thickness T1 along a space limited by the hole pattern 30 having a high aspect ratio, a process having an excellent step coverage may be used.

The first thickness T1 may range from about 40 Å to about 80 Å but is not limited thereto. The first thickness T1 of the first conductive layer 40A may be different according to the purpose of use. However, since the first thickness T1 of the first conductive layer 40A is a middle process for finally obtaining a desired (and/or alternatively predetermined) second thickness T2 (see FIG. 4), the first thickness T1 of the first conductive layer 40A may be determined in consideration of this. That is, the first thickness T1 of the first conductive layer 40A may be a thick enough to totally cover upper and side surfaces of the insulating pattern layer 20 and an exposed surface of the substrate 10 in consideration of a thickness that is to be removed during a subsequent wet etching process.

Figure 3:
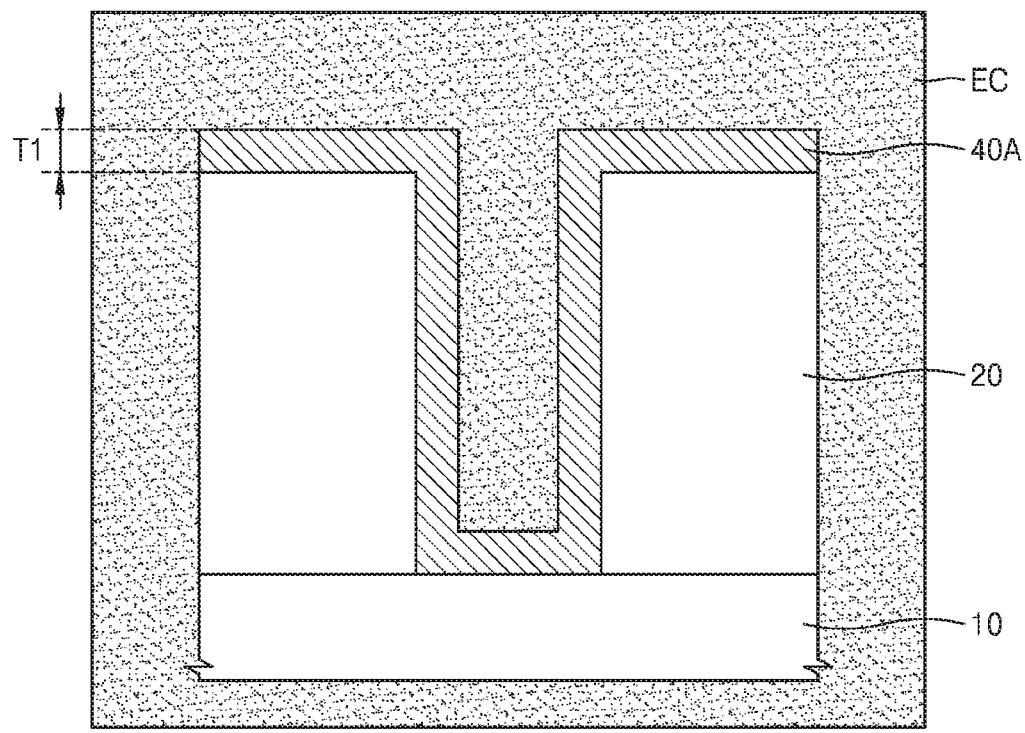

Referring to FIG. 3, a wet etching process may be performed by immersing the substrate 10 including the first conductive layer 40A having the first thickness T1 into a chemical bath containing an etchant EC. The etchant EC may include one of SC1, sulfuric acid, phosphoric acid, acetic acid, and nitric acid, or a combination thereof. SC1 is a generally used solution in which ammonia ($NH_4OH$), hydrogen peroxide ($H_2O_2$), and deionized water ($H_2O$) are mixed with a mixture ratio of about 1:4:20.

Unlike a dry etching process that is an anisotropic etching process, when the first conductive layer 40A is etched by the wet etching process that is an isotropic etching process, the first conductive layer 40A may be etched with the same etching rate in all areas contacting the etchant EC.

The etchant EC may be prepared to etch the first conductive layer 40A with an etching rate ranging from about 1 Å to about 10 Å per minute. The etchant EC may be selected in consideration of various variables for adjusting the etching rate, for example, concentration of the etchant EC, temperature, an etching time, and a relationship with an etch target layer. When the etchant EC has an etching rate that is greater than about 10 Å per minute, it may be difficult to control a target etching amount of the first conductive layer 40A. When the etchant EC has an etching rate that is less than about 1 Å per minute, the wet etching process may take longer than desired.

Figure 4:
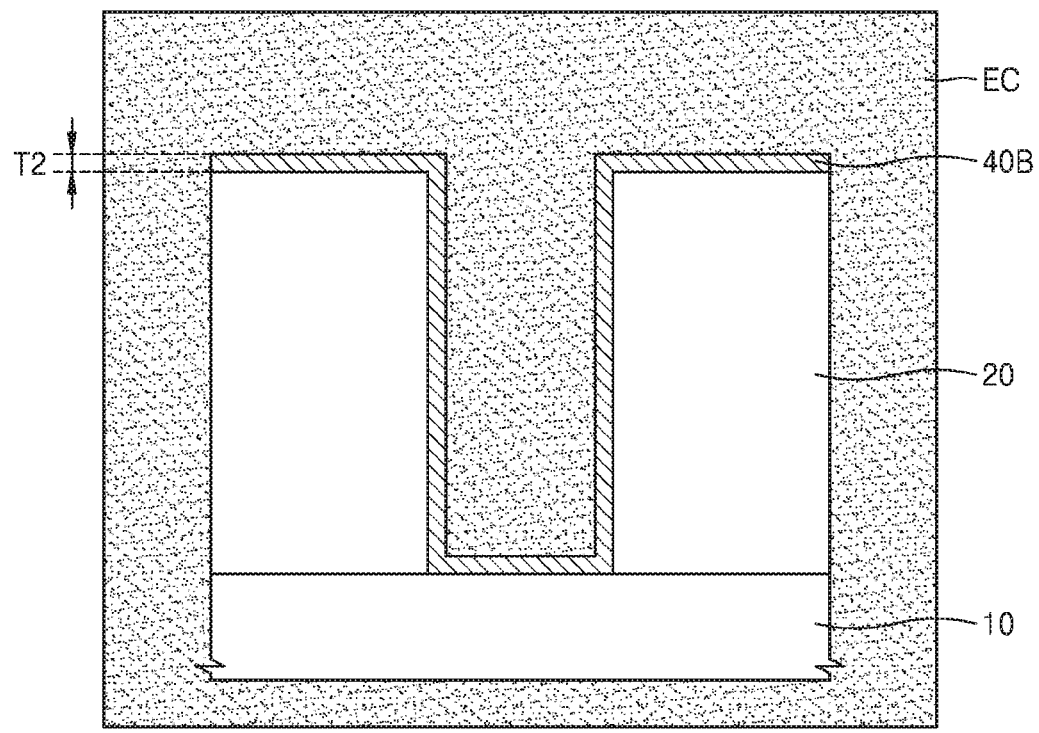

Referring to FIG. 4, the first conductive layer 40A (see FIG. 3) may be etched with the same etching rate in all areas contacting the etchant EC, and thus a first conductive layer 40B having a desired (and/or alternatively predetermined) second thickness T2 may be formed.

The second thickness T2 of the first conductive layer 40B may be formed to be less than half of the first thickness T1 (see FIG. 3) of the first conductive layer 40A. For example, the first conductive layer 40A may be wet etched so that the second thickness T2 of the first conductive layer 40B may range from about 5 Å to about 20 Å, but is not limited thereto.

When the first thickness T1 of the first conductive layer 40A initially ranges from about 5 Å to about 20 Å, according to a geometrical structure of the hole pattern 30 (see FIG. 1), a method of forming the first conductive layer 40A, and a type of a material of the first conductive layer 40A, a thickness of a part of the first conductive layer 40A and a thickness of another part thereof may be different. In some cases, a disconnection may occur in a part of the first conductive layer 40A.

In some example embodiments of inventive concepts, a wet etching process may be used, and thus, all areas of the first conductive layer 40A may be etched by the same amount. That is, the second thickness T2 of the first conductive layer 40B resulting from wet etching may be substantially the same in all areas of the first conductive layer 40B.

Although not shown, after the wet etching process, a cleaning operation of the substrate 10 on which the first conductive layer 40B is formed may be performed using deionized water.

Figure 5:
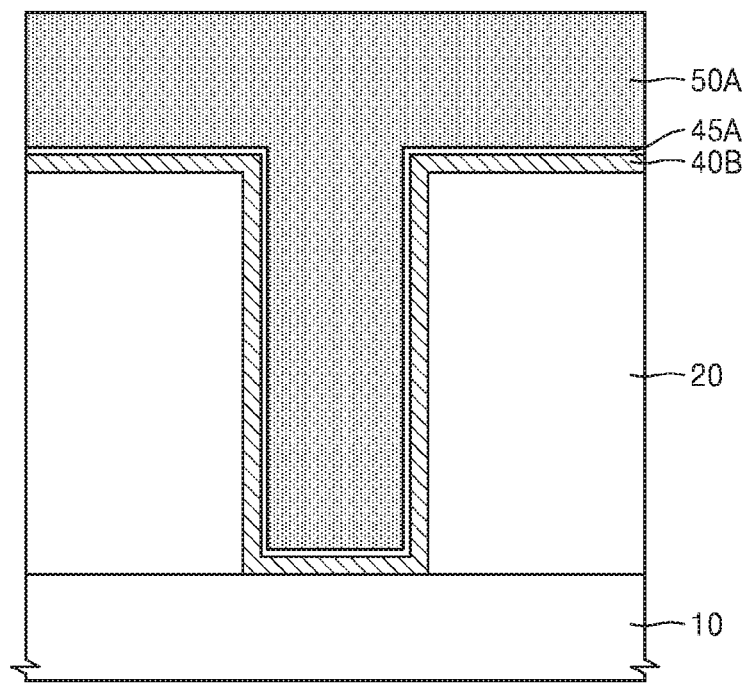

Referring to FIG. 5, a second conductive layer 50A may be formed on the wet etched first conductive layer 40B, and thus a spaced limited by the hole pattern 30 (see FIG. 1) may be completely filled.

The second conductive layer 50A may include a material different from that of the first conductive layer 40B. For example, the second conductive layer 50A may include one of W, Ti, Al, Co, Cu, Ta, WSi, TiSi, TaSi, and CoSi, or a combination thereof. The second conductive layer 50A may include different materials according to the purpose of use. For example, the second conductive layer 50A, along with the first conductive layer 40B, may be used as a contact plug, a via, or a metal interconnection layer and may include different materials in each case.

Similarly to forming the first conductive layer 40A (see FIG. 2), the second conductive layer 50A may be formed by a CVD process, an MOCVD process, an ALD process, an MOALD process, or an electroplating process but is not limited thereto.

A first thin film layer 45A may be formed between the first conductive layer 40B and the second conductive layer 50A. The first thin film layer 45A may be an amorphous layer. The first thin film layer 45A may be an intermetallic compound formed by a chemical reaction of a chemical element constituting (and/or included in) the wet etched first conductive layer 40B and a chemical element constituting (and/or included in) the second conductive layer 50A. In some example embodiments, the first thin film layer 45A may not be formed or may be formed as a crystalline layer.

Figure 6:
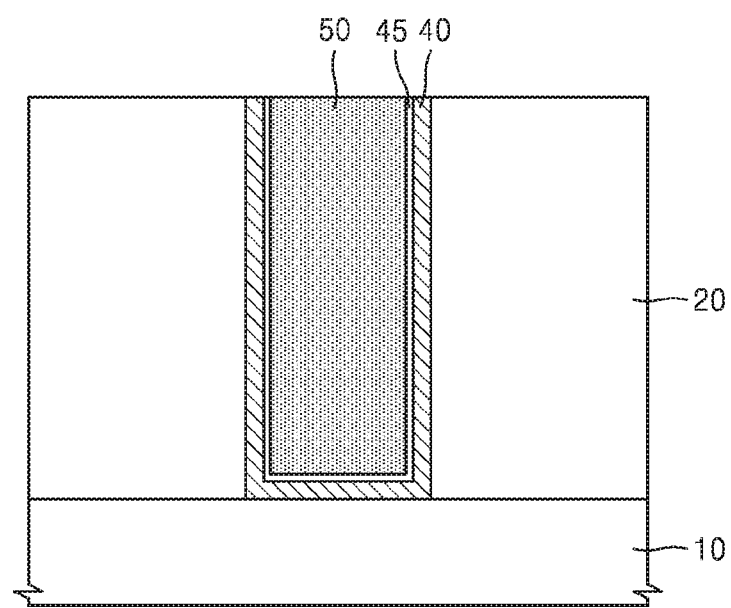

Referring to FIG. 6, each of the second conductive layer 50A, the first thin film layer 45A, and the first conductive layer 40B may be partially removed in order to expose an upper surface of the insulating pattern layer 20.

For example, a chemical mechanical polishing (CMP) method or an etch-back method may be used to sequentially polish the second conductive layer 50A, the first thin film layer 45A, and the first conductive layer 40B.

The polished second conductive layer 50A, first thin film layer 45A, and first conductive layer 40B may fill the hole pattern 30 (see FIG. 1). A level of an upper surface of the polished second conductive layer 50A, first thin film layer 45A, and first conductive layer 40B may be substantially the same as a level of the upper surface of the insulating pattern layer 20.

According to some example embodiments of inventive concepts, a first conductive layer 40 may be formed as an ultra-thin film having substantially a uniform thickness along a side wall of the hole pattern 30 having a high aspect ratio. Accordingly, a gap-fill margin of a second conductive layer 50 may be increased, and electrical characteristics of the semiconductor device may be enhanced.

As electronic devices have become more multifunctional, semiconductor devices including memory devices are used to have high capacity and high integration. As the size of a memory cell for high capacity and high integration has been reduced, operation circuits included in a memory device and an interconnection structure for operation of the memory device and electrical connection have become complicated. Accordingly, a semiconductor device including a memory device having enhanced integration and excellent electrical characteristics is desired. One of the memory structures capable of implementing such high capacity and high integration may be a non-volatile vertical memory device.

According to some example embodiments of inventive concepts, in a structure including an ultra-thin film like a gate electrode layer of a non-volatile vertical memory device, the semiconductor device may be manufactured where the gate electrode layer is continuously formed with a uniform thickness.

Because of a characteristic of a geometrical structure of the gate electrode layer of the non-volatile vertical memory device, if a WF-based process gas may be used to form a gate conductive layer including, for example, tungsten (W) on the gate electrode layer, a fluorine (F) gas that is a reaction by-product of the process gas may remain in an inner opening of the gate electrode layer. The fluorine (F) gas may damage a silicon oxide layer in an insulating spacer and a mold layer around the gate electrode layer.

To limit and/or prevent damaging the silicon oxide layer, a first conductive layer 40 according to some example embodiments of inventive concepts may be formed. A thickness of the gate electrode layer may be continuously reduced in order to achieve the gap-fill margin of the gate conductive layer. Since the gate electrode layer may be formed as the ultra-thin film due to the reduced thickness thereof, it may be difficult to continuously form the gate electrode layer with a uniform thickness, which may deteriorate the electrical characteristics of the memory device.

According to some example embodiments of inventive concepts, a gate electrode layer having a great thickness may be formed and a wet etching process may be performed. Thus, the gate electrode layer may be finally formed as an ultra-thin film and may have a uniform thickness. Thus, a thickness of the gate electrode layer may be reduced without deteriorating electrical characteristics of a memory device, a gap-fill margin of a subsequent gate conductive layer may be achieved, thereby limiting and/or preventing damage to a silicon oxide layer, and the gate electrode layer and the gate conductive layer may be stably formed.

A non-volatile vertical memory device according to some example embodiments of inventive concepts will be described below.

Figure 7:
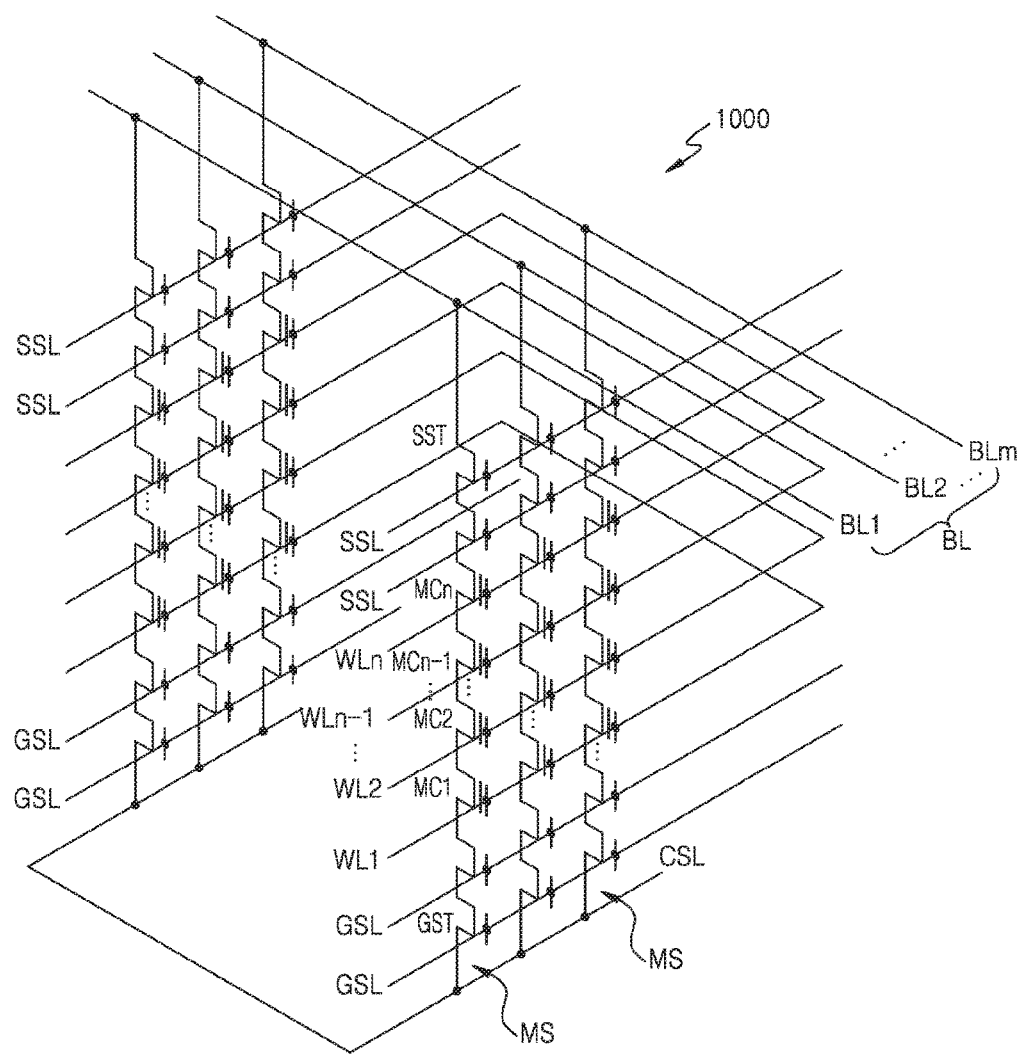
FIG. 7 is an equivalent circuit diagram of a memory cell array of a non-volatile vertical memory device manufactured by using a method of manufacturing a semiconductor device, according to some example embodiments of inventive concepts.

FIG. 7 is an equivalent circuit diagram of a memory cell array 1000 of a non-volatile vertical memory device manufactured by using a method of manufacturing a semiconductor device, according to some example embodiments of inventive concepts.

Referring to FIG. 7, the memory cell array 1000 may include a plurality of memory cell strings MS. The memory cell array 1000 may include a plurality of bit lines BL (e.g., BL: BL1, BL2, . . . , BLm), a plurality of word lines WL (e.g., WL1, WL2, . . . , WLn−1, WLn), at least one string selection line SSL, at least one ground selection line GSL, and a common source line CSL. The plurality of memory cell strings MS may be formed between the plurality of bit lines BL and the plurality of word lines WL.

Each of the plurality of memory cell strings MS may include a string selection transistor SST, a ground selection transistor GST, and a plurality of memory cell transistors MC1, MC2, . . . , MCn−1, and MCn. A drain area of the string selection transistor SST may be connected to the bit lines BL: BL1, BL2, . . . , BLm. A source area of the ground selection transistor GST may be connected to the common source line CSL. The common source line CSL may be an area that is commonly connected to source areas of the plurality of ground selection transistors GST.

The string selection transistor SST may be connected to the string selection line SSL. The ground selection transistor GST may be connected to the ground selection line GSL. The plurality of memory cell transistors MC1, MC2, . . . , MCn−1, and MCn may be respectively connected to the word lines WL: WL1, WL2, . . . , WLn−1.

The memory cell array 1000 may be aligned in a 3-dimension (3D) structure. The plurality of memory cell transistors MC1, MC2, . . . , MCn−1 constituting (and/or included in) the memory cell array 1000 may have a serially connected structure along a vertical direction with respect to an upper surface of a substrate 100 (see FIGS. 8A through 8L). Accordingly, the string selection transistor SST, the ground selection transistor GST, and the plurality of memory cell transistors MC1, MC2, . . . , MCn−1, and MCn may be formed such that each channel area may extend in a substantially vertical direction with respect to the upper surface of the substrate 100. In FIG. 7, a structure of the string selection transistor SST and/or ground selection transistor GST may be different than a structure of the memory cell transistors MCn. For example, the charge trap layer may be omitted in the string selection transistor SST and/or ground selection transistor GST. Alternatively, the structure of the string selection transistor SST and/or ground selection transistor GST may be the same as a structure of the memory cell transistors MCn.

FIGS. 8A through 8L are cross-sectional views for sequentially describing a method of manufacturing a non-volatile vertical memory device by using a method of manufacturing a semiconductor device, according to some example embodiments of inventive concepts.

Figure 8A:
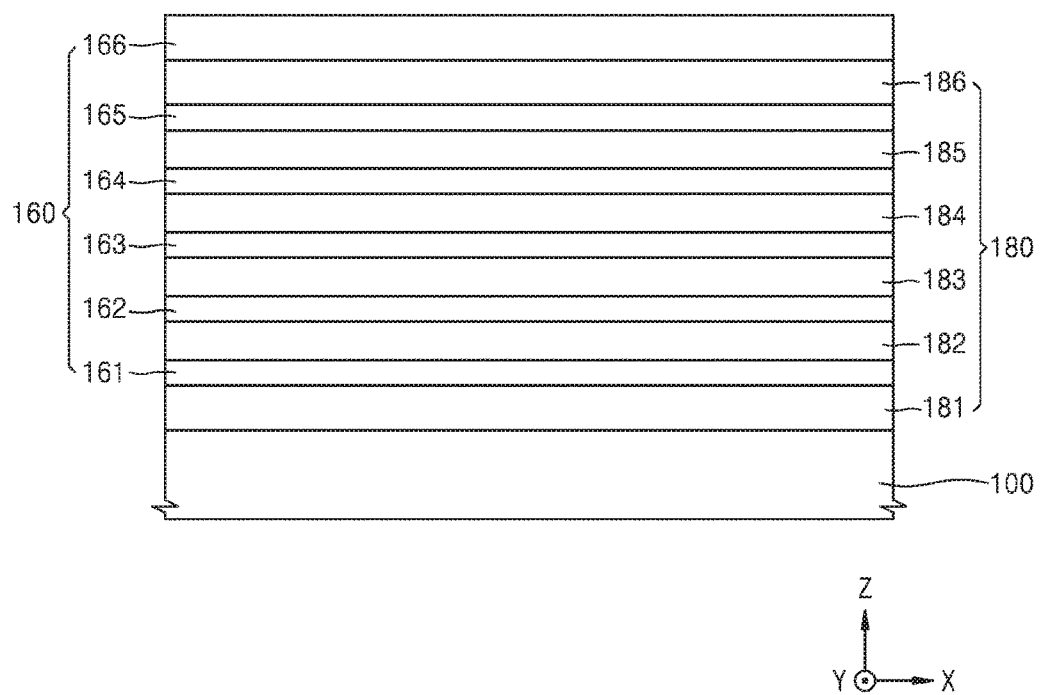
FIGS. 8A through 8L are cross-sectional views for sequentially describing a method of manufacturing a non-volatile vertical memory device by using a method of manufacturing a semiconductor device, according to some example embodiments of inventive concepts.

Referring to FIG. 8A, sacrificial layers 180 and interlayer insulating layers 160 may be alternately stacked on the substrate 100.

The substrate 100 may be the same as described with reference to FIG. 1, and thus a detailed description thereof is omitted. The substrate 100 may be, for example, a silicon wafer. In some example embodiments, a lower structure (not shown) including at least one transistor may be between the substrate 100, the sacrificial layers 180, and the interlayer insulating layers 160.

However, for ease of understanding inventive concepts, an example in which the sacrificial layers 180 and the interlayer insulating layers 160 are directly formed on the substrate 100 will be described. However, inventive concepts are not limited thereto.

The interlayer insulating layers 160 may include a plurality of insulating layers 161 through 166. The sacrificial layers 180 may include a plurality of sacrificial layers 181 through 186. The plurality of insulating layers 161 through 166 and the plurality of sacrificial layers 181 through 186 may be alternately stacked on the substrate 100 by starting with the sacrificial layer 181 that is the lowermost layer, as shown in FIG. 8A. The sacrificial layers 180 may include a material that may be etched with etch selectivity with respect to the interlayer insulating layers 160. That is, during a process of etching the sacrificial layers 180 by using a desired (and/or alternatively predetermined) etching recipe, the sacrificial layers 180 may include a material that may be etched while minimizing etching of the interlayer insulating layers 160. The etch selectivity may quantitatively be a ratio of etching rates of the sacrificial layers 180 with respect to etching rates of the interlayer insulating layers 160.

In some example embodiments, the sacrificial layers 180 may include one of materials having etch selectivity ranging from about 1:10 to about 1:200 or from about 1:30 to about 1:100 with respect to the interlayer insulating layers 160. For example, the interlayer insulating layers 160 may be one of silicon oxide and silicon nitride, or a combination thereof, and the sacrificial layers 180 may include one of a silicon layer, a silicon oxide layer, a silicon carbide layer, and a silicon nitride layer, or a combination thereof and may include a material different from a material of the interlayer insulating layers 160. However, for ease of understanding inventive concepts, an example in which the interlayer insulating layers 160 include a silicon oxide layer and the sacrificial layers 180 include a silicon nitride layer directly formed on the substrate 100 will be described.

In some example embodiments, a first sacrificial layer 181 and a sixth sacrificial layer 186 may have thicknesses greater than those of second through fifth sacrificial layers 182 through 185. Thicknesses of the first sacrificial layer 181 and the sixth sacrificial layer 186 may determine thicknesses of gates of the string selection transistor SST and the ground selection transistor GST and may be greater than thicknesses of gates of memory cell transistors. MC1 through MC4 that are determined according to thicknesses of the second through fifth sacrificial layers 182 through 185 so that a sufficient current may be supplied to memory cell strings MS.

Thicknesses of a first interlayer insulating layer 161 and the fifth interlayer insulating layer 165 may be greater than those of the second through fourth interlayer insulating layers 162 through 164.

However, the thicknesses of the interlayer insulating layers 160 and the sacrificial layers 180 may be modified in various ways. The number of layers constituting (and/or included in) the interlayer insulating layers 160 and the sacrificial layers 180 may also be modified in various ways.

Figure 8B:
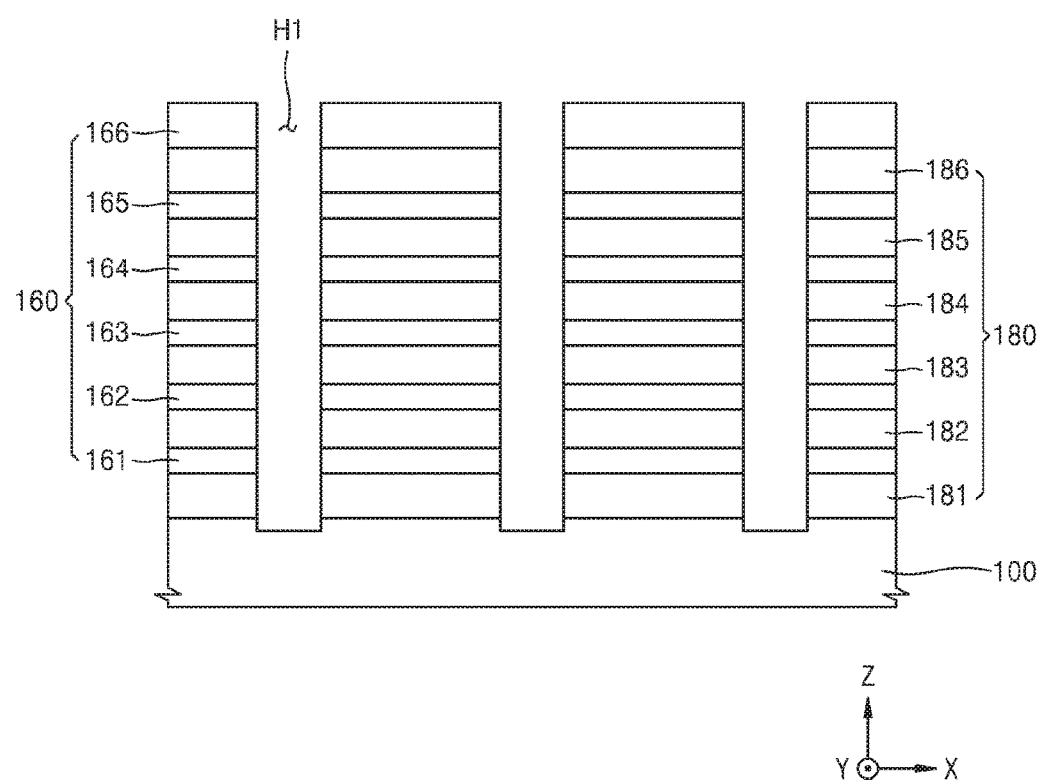

Referring to FIG. 8B, first openings H1 that penetrate the interlayer insulating layers 160 and the sacrificial layers 180 that are alternately stacked may be formed. The first openings H1 may limit an area in which semiconductor structures 120 (see FIG. 8C) and insulating layers (not shown) are to be formed. The first openings H1 may be trenches having a depth in a Z direction and extending in a Y direction. The first openings H1 may be separated from each other by a desired (and/or alternatively predetermined) distance in an X direction and may be repeatedly formed.

An operation of forming the first openings H1 may include an operation of forming a desired (and/or alternatively predetermined) mask pattern defining locations of the first openings H1 on the interlayer insulating layers 160 and the sacrificial layers 180 that are alternately stacked and an operation of anisotropic etching the interlayer insulating layers 160 and the sacrificial layers 180 alternately by using the mask pattern as an etching mask.

In some example embodiments, when the interlayer insulating layers 160 and the sacrificial layers 180 are directly formed on the substrate 100, the first openings H1 may be formed to partially expose an upper surface of the substrate 100 as shown in FIG. 8B. In addition, as a result of over-etching in the anisotropic etching operation, the substrate 100 below the first openings H1 may be recessed with a desired (and/or alternatively predetermined) depth, as shown in FIG. 8B.

Figure 8C:
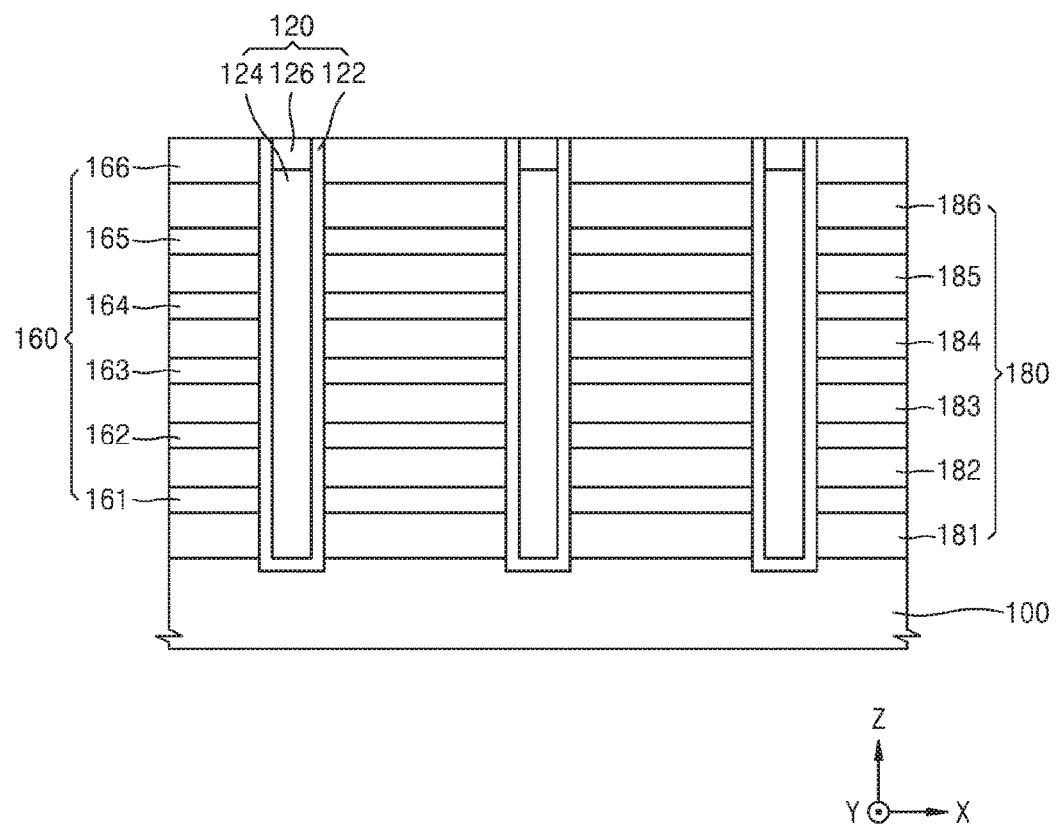

Referring to FIG. 8C, a semiconductor layer 122 may be formed to conformally cover side walls and lower surfaces of the first openings H1 (see FIG. 8B). The semiconductor layer 122 may include silicon. For example, the semiconductor layer 122 may include a silicon epitaxial layer having a polycrystalline or single crystalline structure. The semiconductor layer 122 may be formed by one of CVD and ALD processes. The semiconductor layer 122 may have a certain thickness, for example, a thickness ranging from about $\frac{1}{50}$ to about $\frac{1}{5}$ of widths of the first openings H1. Accordingly, an inner opening may be formed in the semiconductor layer 122.

The inner opening may be filled by an insulating pillar 124. The insulating pillar 124 may include an oxide layer such as Undoped Silica Glass (USG), Spin On Glass (SOG), or Tonen SilaZene (TOSZ). In some example embodiments, before the insulating pillar 124 fills the inner opening, an annealing operation of thermally treating a structure in which the semiconductor layer 122 is formed in a gas atmosphere including hydrogen or heavy hydrogen may be performed. Many crystalline defects in the semiconductor layer 122 may be cured by the annealing operation.

To remove unnecessary semiconductor material and insulating material covering the sixth interlayer insulating layer 166 that is the uppermost layer, a planarization process, for example, a CMP or etch-back process, may be performed so that the sixth interlayer insulating layer 166 is exposed. Thus, the semiconductor layer 122 and the insulating layer 124 may be formed inside the first openings H1.

An upper portion of the insulating layer 124 may be removed by using an etching process. A conductive layer 126 may be formed in a location from which the upper portion of the insulating layer 124 is removed. The conductive layer 126 may include doped polysilicon. The planarization process that is performed so that the sixth interlayer insulating layer 166 that is the uppermost layer is exposed may be performed again, and thus the conductive layer 126 may be arranged on the insulating pillar 124 and connected to the semiconductor layer 122.

In some example embodiments, the semiconductor layer 122 may be formed inside the whole first openings H1. In this case, an operation of forming the insulating pillar 124 may be omitted. To form the conductive layer 126 in an upper portion of the semiconductor layer 122, impurities may be injected into the upper portion of the semiconductor layer 122 that totally fills the inside of the first openings H1 and thus an area corresponding to the conductive layer 126 may be formed therein.

In some example embodiments, to form a gate dielectric layer, before the semiconductor layer 122 is formed in the first openings H1, for example, a tunneling insulating layer 131 (see FIG. 9) may be formed on side walls of the first openings H1.

Figure 8D:
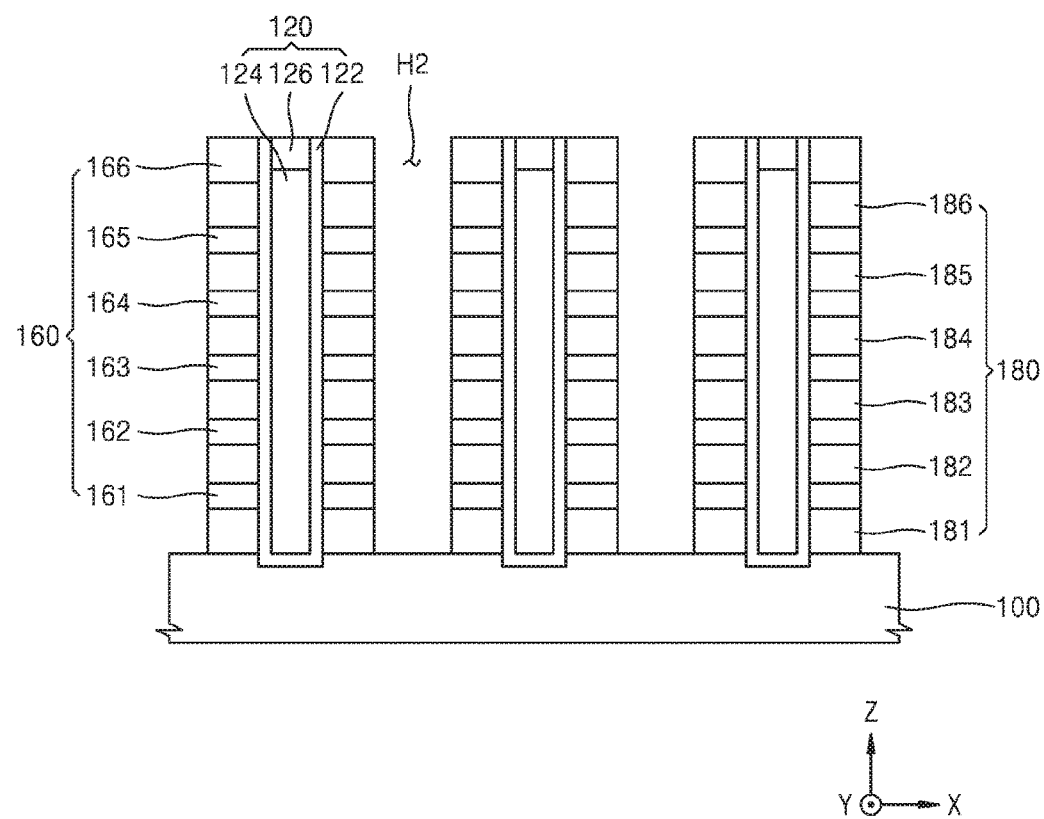

Referring to FIG. 8D, second openings H2 that expose another part of the upper surface of the substrate 100 may be formed in the structure of FIG. 8C. The second openings H2 may have a width that is slightly greater than a width of an area in which a contact electrode 170 (see FIG. 8K) and insulating spacers 110 (see FIG. 8K) arranged in both sides of the contact electrode 170 are to be formed. For example, the second openings H2 may be at least twice a thickness of a gate dielectric layer 130 (see FIG. 8K). The second openings H2 may be vertically formed in the substrate 100 between the first openings H1 (see FIG. 8B).

An operation of forming the second openings H2 may include an operation of forming an etching mask defining the second openings H2 on the structure of FIG. 8C and an operation of alternately anisotropy etching the interlayer insulating layers 160 and the sacrificial layers 180 below the etching mask so that the other part of the upper surface of the substrate 100 is exposed.

In some example embodiments, as shown in FIG. 8D, the second openings H2 and the first openings H1 may be alternately formed in the X direction. That is, the number of first openings H1 and second openings H2 at the same X coordinates in the X direction may be substantially the same. However, inventive concepts are not limited thereto. Relative locations of the first openings H1 and the second openings H2 may be different.

Figure 8E:
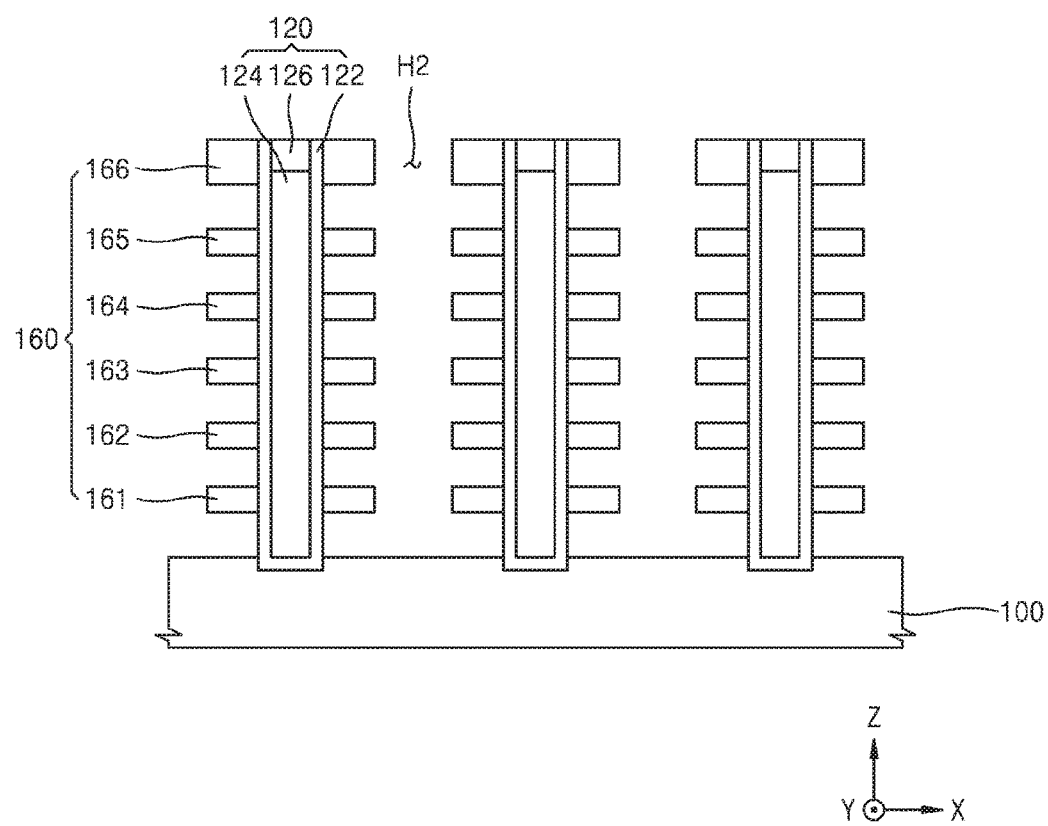

Referring to FIG. 8E, the sacrificial layers 180 (see FIG. 8D) exposed through the second openings H2 may be selectively removed, and thus recess areas may be formed between the interlayer insulating layers 160. The recess areas may be gap areas horizontally extending from the second openings H2 and exposing some side walls of the semiconductor structures 120.

An operation of forming the recess areas may include an operation of horizontally etching the sacrificial layers 180 by using an etching recipe having etch selectivity with respect to the interlayer insulating layers 160. For example, when the sacrificial layers 180 are silicon nitride layers and the interlayer insulating layers 160 are silicon oxide layers, the operation of horizontally etching the sacrificial layers 180 may be performed by using an etchant containing phosphoric acid.

Figure 8F:
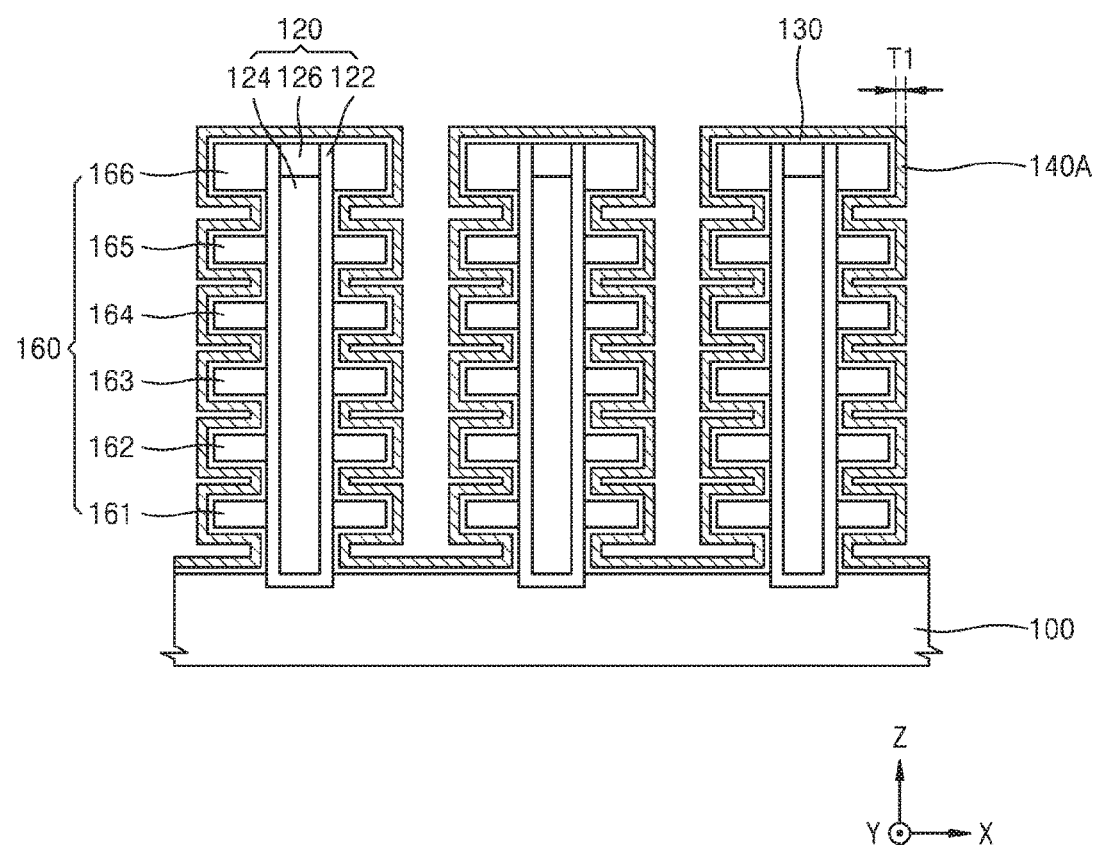

Referring to FIG. 8F, the gate dielectric layer 130 may be formed to conformally cover the semiconductor structures 120, the interlayer insulating layers 160, and the substrate 100 that are exposed by the second openings H2 and the recess areas. The gate dielectric layer 130 may include a tunneling insulating layer 131 (see FIG. 9), a charge storing layer 132 (see FIG. 9), and a barrier insulating layer 133 (see FIG. 9). Thus, the gate dielectric layer 130 may be formed to cover the semiconductor structures 120, the interlayer insulating layers 160, and the substrate 100 in the order of the tunneling insulating layer 131, the charge storing layer 132, and the barrier insulating layer 133. The tunneling insulating layer 131, the charge storing layer 132, and the barrier insulating layer 133 may have the same thickness through a CVD process or an ALD process. The gate dielectric layer 130 may also be formed on an upper surface of the sixth interlayer insulating layer 166 that is the uppermost layer and an upper surface of the conductive layer 126, and thus function as an anti-etching layer that limits and/or prevents etching of the upper surface of the sixth interlayer insulating layer 166 that is the uppermost layer.

The gate dielectric layer 130 may be conformally formed with a desired (and/or alternatively predetermined) thickness, and thus inner openings may be formed in the second openings H2 and the recess areas. A gate electrode layer 140A may be included in the inner openings surrounded by the gate dielectric layer 130 and may be conformally formed on the gate dielectric layer 130 with the first thickness T1. The interlayer insulating layers 160 and semiconductor structures 120 may also be referred to as a preliminary structure. The second openings H2 may be also be referred to as openings defined by the preliminary structure.

The gate electrode layer 140A may include a material similar to that of the first conductive layer 40A described with reference to FIG. 2 above. For example, the gate electrode layer 140A may include tantalum (TaN). The gate electrode layer 140A may be formed by using a similar process to that of the first conductive layer 40A. For example, the gate electrode layer 140A may be formed by using a CVD process or an ALD process.

The gate electrode layer 140A may be conformally formed on the gate dielectric layer 130 with the first thickness T1, and thus inner openings may be formed in the second openings H2 and the recess areas. That is, the gate electrode layer 140A may be formed with the first thickness T1 by which the inner openings are formed. For example, the first thickness T1 may range from about 40 Å to about 80 Å, but is not limited thereto.

The gate electrode layer 140A may also be formed on the upper surface of the sixth interlayer insulating layer 166 that is the uppermost layer and the upper surface of the conductive layer 126, and thus function as an anti-etching layer that limits and/or prevents etching of the upper surface of the sixth interlayer insulating layer 166 that is the uppermost layer.

Figure 8G:
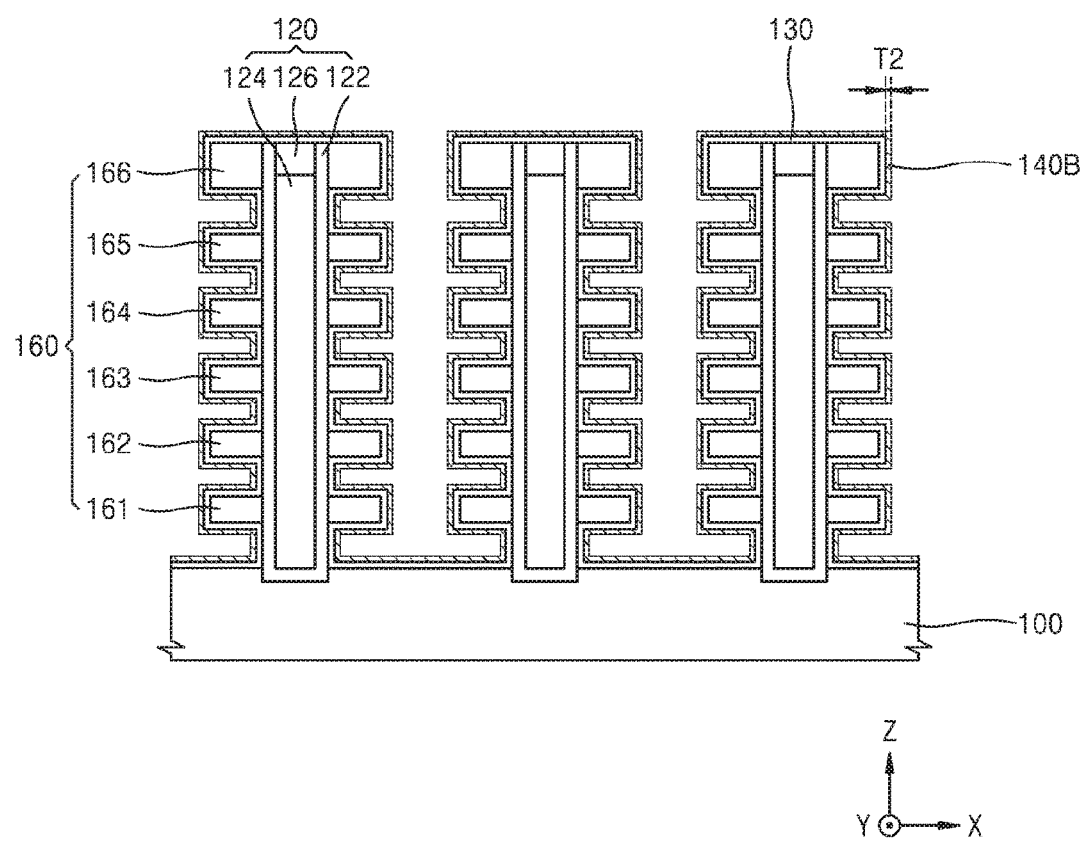

Referring to FIG. 8G, a gate electrode layer 140B having the desired (and/or alternatively predetermined) second thickness T2 may be formed by performing a wet etching operation of removing a part of the gate electrode layer 140A (see FIG. 8F).

The second thickness T2 of the wet etched gate electrode layer 140B may be formed to be less than half of the first thickness T1 of the gate electrode layer 140A (see FIG. 8F). For example, the wet etched gate electrode layer 140B may be formed by wet etching so that the second thickness T2 may range from about 5 Å to about 20 Å. A method and a process of performing wet etching to form the wet etched gate electrode layer 140B are similar to those of wet etching the first conductive layer 40A described with reference to FIG. 3 above, and thus detailed descriptions thereof are omitted.

When the first thickness T1 of the gate electrode layer 140A initially ranges from about 5 Å to about 20 Å, according to a geometrical structure of the non-volatile vertical memory device, a method of forming the gate electrode layer 140A, and a type of a material of the gate electrode layer 140A, a thickness of a part of the gate electrode layer 140A and a thickness of another part thereof may be different. In some cases, a disconnection may occur in a part of the gate electrode layer 140A.

In inventive concepts, a wet etching process may be used, and thus, all areas of the gate electrode layer 140A may be etched by the same amount. That is, the second thickness T2 of the wet etched gate electrode layer 140B may be substantially the same in all areas. A disconnection in a part of the gate electrode layer 140A may be reduced.

Figure 8H:
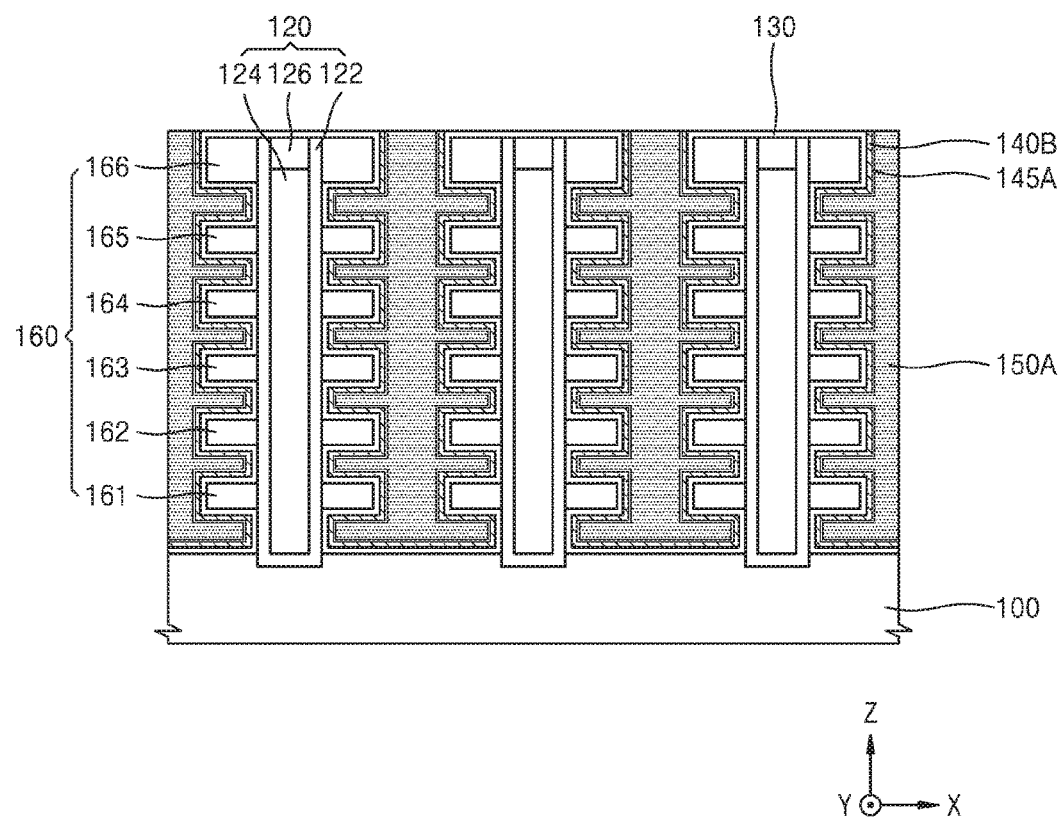

Referring to FIG. 8H, a gate conductive layer 150A may be formed on the wet etched gate electrode layer 140B, and thus entirely filling inner openings surrounded by the gate electrode layer 140B.

The gate conductive layer 150A may include a material different from that of the wet etched gate electrode layer 140B. The gate conductive layer 150A may include a material similar to that of the second conductive layer 50A described with reference to FIG. 5 above. For example, the gate conductive layer 150A may include tungsten (W).

Similarly to a process of forming the second conductive layer 50A, a process of forming the gate conductive layer 150A may include a CVD process, an MOCVD process, an ALD process, an MOALD process, or an electroplating process but is not limited thereto.

An interface thin film layer 145A may be formed between the wet etched gate electrode layer 140B and the gate conductive layer 150A. The interface thin film layer 145A may be an amorphous layer. The interface thin film layer 145A may be an intermetallic compound formed by a chemical reaction of a chemical element constituting (and/or included in) the wet etched gate electrode layer 140B and a chemical element constituting (and/or included in) the gate conductive layer 150A. In some example embodiments, the interface thin film layer 145A may not be formed or may be formed as a crystalline layer.

The wet etched gate electrode layer 140B, the interface thin film layer 145A, and the gate conductive layer 150A may be flattened so that the gate dielectric layer 130 formed on an upper portion of the interlayer insulating layer 166 that is the uppermost layer is exposed.

Figure 8I:
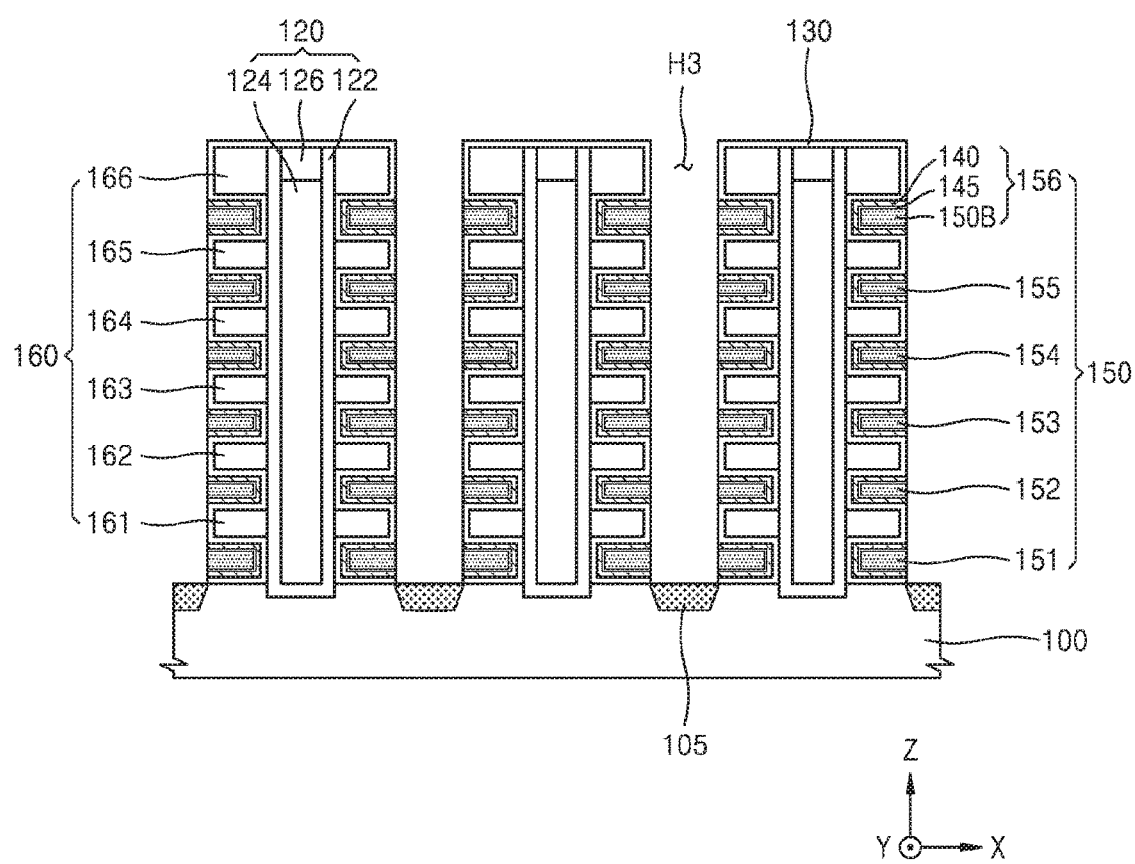

Referring to FIG. 8I, third openings H3 may be formed by partially removing the gate conductive layer 150A (see FIG. 8H), the interface thin film layer 145A (see FIG. 8H), and the wet etched gate electrode layer 140B (see FIG. 8H) so that a part of an upper surface of the substrate 100 is exposed. The gate conductive layer 150A, the interface thin film layer 145A, and the wet etched gate electrode layer 140B may be partially removed through anisotropic etching. Thus, gate electrodes 150 filling a recess area may be formed.

A part of the gate dielectric layer 130 formed on the upper surface of the substrate 100 may be removed through anisotropic etching. In some example embodiments, the gate dielectric layer 130 formed on sidewalls of the interlayer insulating layers 160 may be removed. During a process of etching the gate conductive layer 150A, the interface thin film layer 145A, and the wet etched gate electrode layer 140B, the gate electrodes 150 filling the recess area may be partially recessed toward the semiconductor structures 120.

Impurities may be injected into the substrate 100 through the third openings H3, and thus an impurity area 105 may be formed extending in a Y direction adjacent to the upper surface of the substrate 100. The impurity area 105 may have the same conductivity as or an opposite conductivity to that of the substrate 100. When the impurity area 105 has an opposite conductivity to that of the substrate 100, the impurity area 105 and the substrate 100 may constitute a P-N junction. In some example embodiments, each of the impurity areas 105 may be connected to each other in an equipotential state.

Figure 8J:
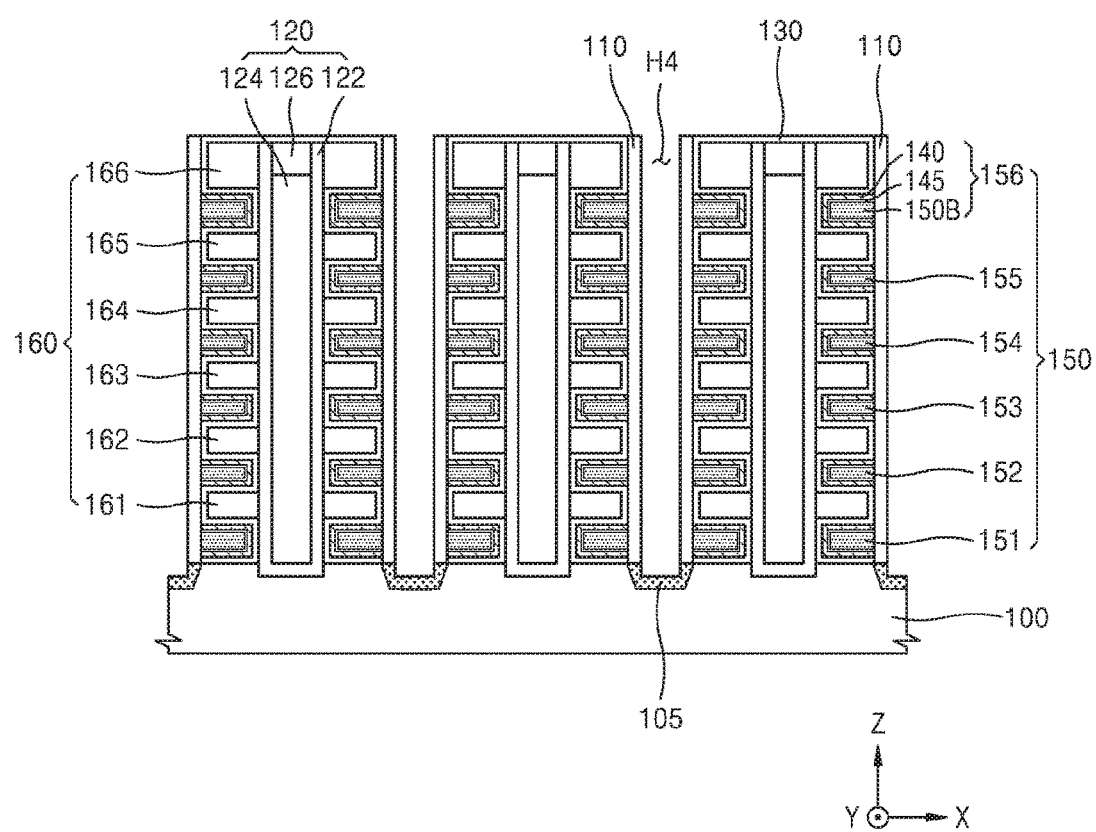

Referring to FIG. 8J, insulating spacers 110 may be formed in sidewalls of the third openings H3. The insulating spacers 110 may include an insulating material having etch selectivity with respect to a material of the gate electrodes 150 and a material of the gate dielectric layer 130, in particular, a barrier insulating layer 133 (see FIG. 9). The insulating spacers 110 may be formed by filling the third openings H3 with the insulating material and partially removing the insulating material through isotropic etching. Fourth openings H4 having a desired (and/or alternatively predetermined) thickness, defined by the insulating spacers 110 and having a width that is less than the third openings H3, may be formed in the insulating spacers 110 formed by isotropic etching. Isotropic etching may be over etching, and thus an upper surface of the impurity area 105 may be recessed.

Figure 8K:
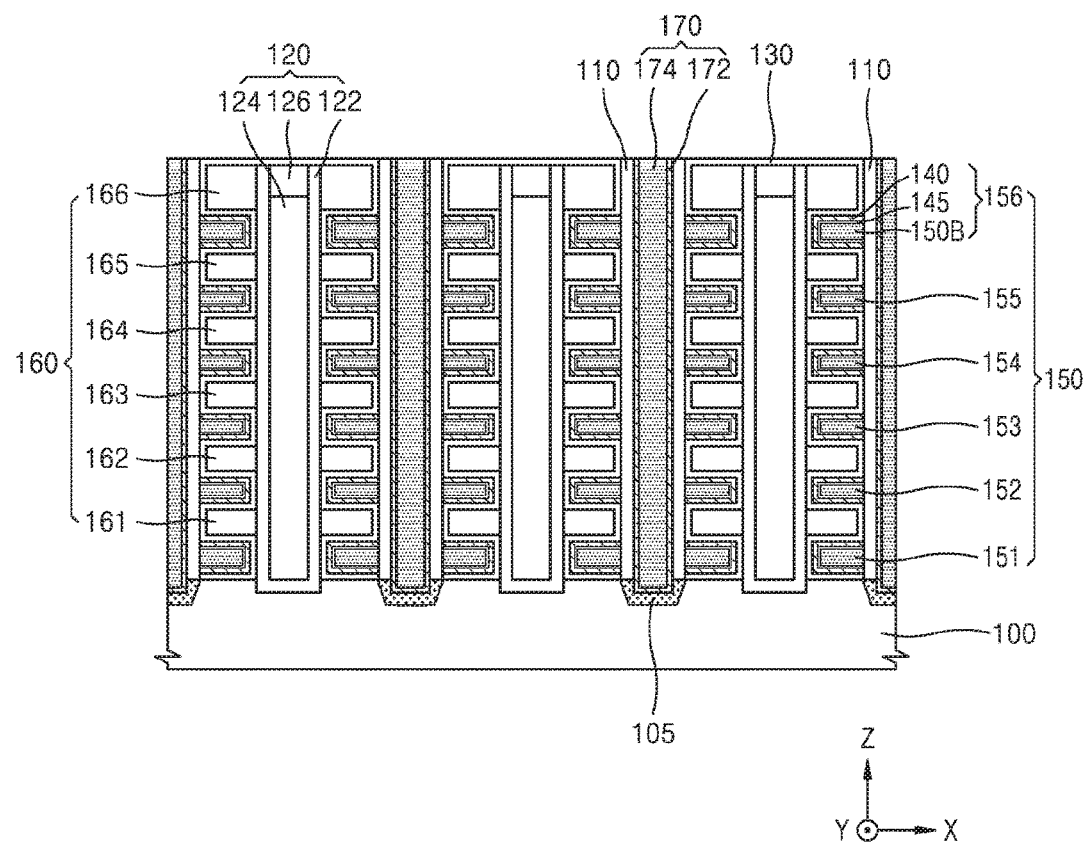

Referring to FIG. 8k, the fourth openings H4 may be filled with a conductive material, and thus a contact electrode 170 including a barrier metal layer 172 and a contact electrode layer 174 that are in ohmic contact with the impurity area 105 may be formed. To reduce a contact resistance of the impurity area 105 and limit and/or prevent diffusion of a material constituting (and/or included in) the contact electrode layer 174, the barrier metal layer 172 may be formed before the contact electrode layer 714 is formed.

The barrier metal layer 172 may be formed with a third thickness and then wet etched in order to have a desired (and/or alternatively predetermined) fourth thickness that is less than the third thickness, and the contact electrode layer 174 including a material different from that of the barrier metal layer 172 may be formed on the barrier metal layer 172, thereby forming the contact electrode 170.

A material of the barrier metal layer 172 and a method of forming the barrier metal layer 172 may be similar to those of the first conductive layer 40 described with reference to FIGS. 2 through 6 above, and a material of the contact electrode layer 174 and a method of forming the contact electrode layer 174 may be similar to those of the second conductive layer 50 described with reference to FIGS. 2 through 6 above, and thus detailed descriptions thereof are omitted.

Although not shown, an interlayer thin film layer may be formed between the barrier metal layer 172 and the contact electrode layer 174. The interface thin film layer may be an amorphous layer. The interface thin film layer may be an intermetallic compound formed by a chemical reaction of a chemical element constituting (and/or included in) the barrier metal layer 172 and a chemical element constituting (and/or included in) the contact electrode layer 174. In some example embodiments, the interface thin film layer may not be formed or may be formed as a crystalline layer.

Figure 8L:
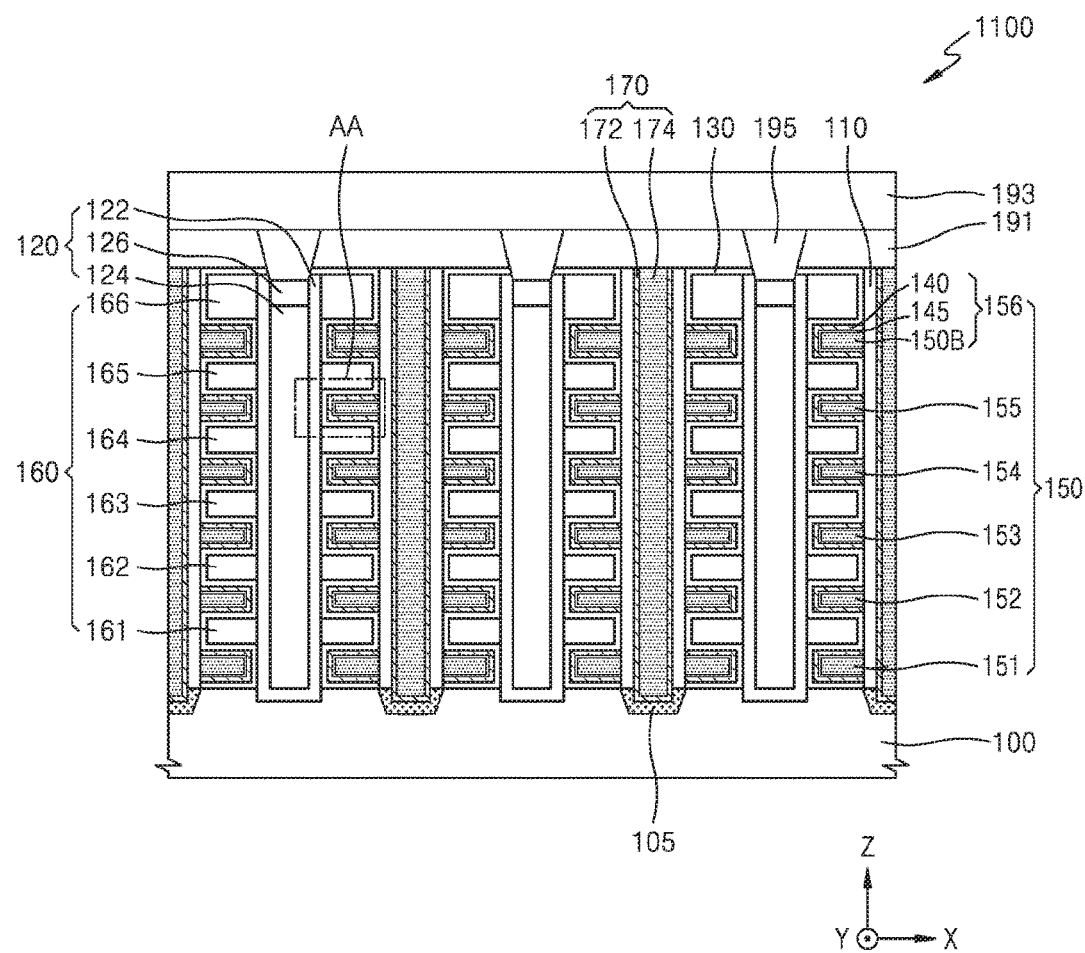

Referring to FIG. 8L, a capping layer 191 may be formed on the structure of FIG. 8K. A bit line contact plug 195 may be formed on the conductive layer 126 of the semiconductor structures 120 to penetrate the capping layer 191. The bit line contact plug 195 may be formed by using a photolithography process and an etching process. A bit line 193 connecting the bit line contact plugs 195 arranged in an X direction may be formed on the capping layer 191. The bit line 193 may be formed in a line shape by using the photolithography process and the etching process. In some example embodiments, the bit line contact plug 195 may have a multilayer structure.

In some example embodiments, a plurality of 3D memory cell strings may be formed vertically from an upper surface of the substrate 100 by using the semiconductor structure 120 as an active area.

Accordingly, a non-volatile vertical memory device 1100 may be formed. According to some example embodiments of inventive concepts, if the gate electrode layer 140 having a great thickness is formed and then formed as an ultra-thin film electrode by using a wet etching process, the gate electrode layer 140 may have a uniform thickness while being as the ultra-thin film electrode. Thus, a thickness of the gate electrode layer 140 may be reduced without deteriorating electrical characteristics of a memory device, a gap-fill margin of the gate conductive layer 150B may be achieved, thereby limiting and/or preventing damage to a silicon oxide layer, and the gate electrode 150 may be stably formed.

Figure 9:
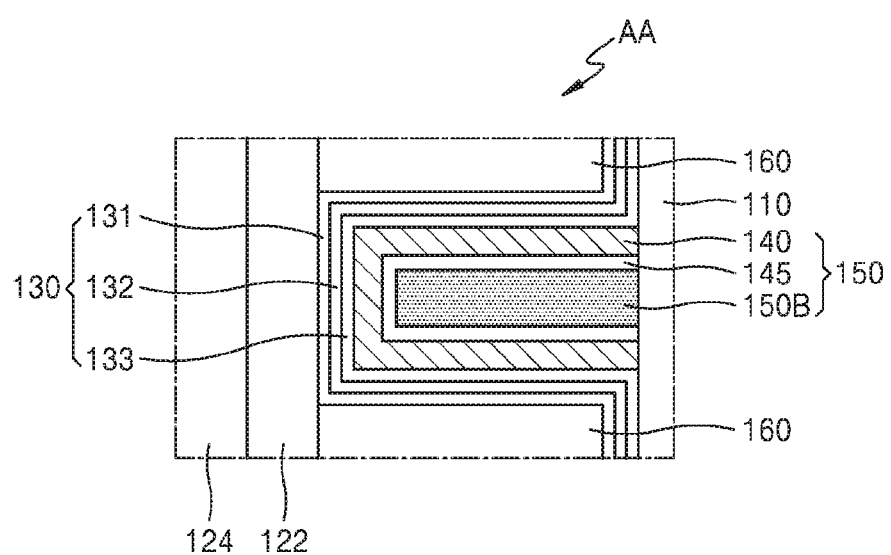
FIG. 9 is a partial enlarged view of a portion AA of FIG. 8L for describing a gate dielectric layer and a gate electrode.

FIG. 9 is a partial enlarged view of a portion AA of FIG. 8L for describing the gate dielectric layer 130 and the gate electrode 150.

FIG. 9 illustrates the semiconductor layer 122 that may be used as a channel by transistors of memory cell strings. The insulating pillar 124 may be arranged on a left surface of the semiconductor layer 122. The gate electrode 150 may be arranged on a right surface of the semiconductor layer 122. The interlayer insulating layers 160 may contact the right surface of the semiconductor layer 122 and may be arranged in upper and lower portions of the gate electrode 150. The gate dielectric layer 130 may be arranged so one surface contacts two surfaces of the upper interlayer insulating layer 160, contacts three surfaces of the gate electrode 150, and contacts two surfaces of the lower interlayer insulating layer 160.

The gate dielectric layer 130 may have a structure in which the tunneling insulating layer 131, the charge storing layer 132, and the barrier insulating layer 133 are sequentially joined from the right surface of the semiconductor layer 122.

The tunneling insulating layer 131 may include one of silicon oxide, silicon nitride, silicon oxynitride, hafnium oxide ($HfO_2$), hafnium silicon oxide ($HfSi_xO_y$), aluminum oxide ($Al_2O_3$), and zirconium oxide ($ZrO_2$) or a combination thereof in a single layer structure or a multilayer structure.

The charge storing layer 132 may be a charge trap layer or a floating gate. When the charge storing layer 132 is a floating gate, the charge storing layer 132 may be formed by depositing polysilicon by using, for example, a low pressure CVD (LPCVD) process. When the charge storing layer 132 is a charge trap layer, the charge storing layer 132 may include one of silicon oxide, silicon nitride, silicon oxynitride, hafnium oxide ($HfO_2$), zirconium oxide ($ZrO_2$), tantalum oxide ($Ta_2O_3$), titanium oxide ($TiO_2$), hafnium aluminum oxide ($HfAl_xO_y$), hafnium tantalum oxide ($HfTa_xO_y$), hafnium silicon oxide ($HfSi_xO_y$), aluminum nitride ($Al_xN_y$), and aluminum gallium nitride ($AlGa_xN_y$), or a combination thereof in a single layer structure or a multilayer structure.

The barrier insulating layer 133 may include one of silicon oxide, silicon nitride, silicon oxynitride, and a high-k dielectric layer, or a combination thereof in a single layer structure or a multilayer structure. The barrier insulating layer 133 may include a material having a dielectric constant that is higher than that of the tunneling insulating layer 131. The high-k dielectric layer may include one of aluminum oxide ($Al_2O_3$), tantalum oxide ($Ta_2O_3$), titanium oxide ($TiO_2$), yttrium oxide ($Y_2O_3$), zirconium oxide ($ZrO_2$), zirconium silicon oxide ($ZrSi_xO_y$), hafnium oxide ($HfO_2$), hafnium silicon oxide ($HfSi_xO_y$), lanthanum oxide ($La_2O_3$), lanthanum aluminum oxide ($LaAl_xO_y$), lanthanum hafnium oxide ($LaHf_xO_y$), hafnium aluminum oxide ($HfAl_xO_y$), and praseodymium oxide ($Pr_2O_3$), or a combination thereof.

The insulating spacer 110 may be arranged in the gate electrode 150 and a right side of the barrier insulating layer 133.

Figure 10:
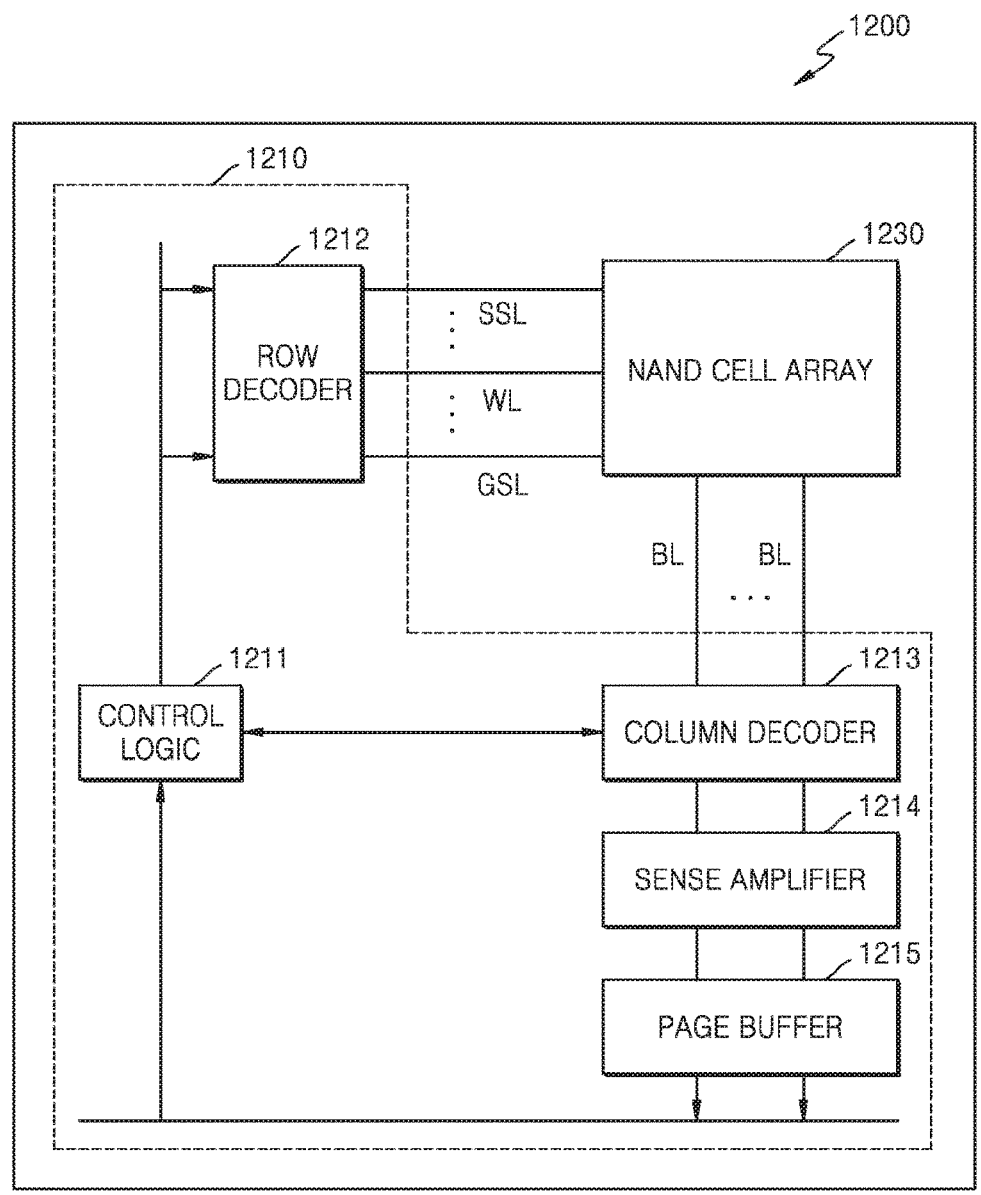
FIG. 10 is a block diagram of a semiconductor device a manufactured by using a method of manufacturing a semiconductor device, according to some example embodiments of inventive concepts.

FIG. 10 is a block diagram of a semiconductor device 1200 manufactured by using a method of manufacturing a semiconductor device, according to some example embodiments of inventive concepts.

Referring to FIG. 10, a NAND cell array 1230 may be coupled to a core circuit unit 1210 in the semiconductor device 1200. For example, the NAND cell array 1230 may include the semiconductor device 1100 manufactured by using a method of manufacturing a semiconductor device of FIGS. 8A through 8L. The core circuit unit 1210 may include a control logic 1211, a row decoder 1212, a column decoder 1213, a sense amplifier 1214, and a page buffer 1215.

The control logic 1211 may communicate with the row decoder 1212, the column decoder 1213, and the page buffer 1215. The row decoder 1212 may communicate with the NAND cell array 1230 through the plurality of string selection lines SSL, the plurality of word lines WL, and the plurality of ground selection lines GSL. The column decoder 1213 may communicate with the NAND cell array 1230 through the plurality of bit lines BL. The sense amplifier 1214 may be connected to the column decoder 1213 when a signal is output by the NAND cell array 1230 and may not be connected to the column decoder 1213 when the signal is transferred to the NAND cell array 1230.

For example, the control logic 1211 may transfer a row address signal to the row decoder 1212, the row decoder 1212 may decode the row address signal and may transfer the decoded row address signal to the NAND cell array 1230 through the plurality of string selection lines SSL, the plurality of word lines WL, and the plurality of ground selection lines GSL. The control logic 1211 may transfer a column address signal to the column decoder 1213 or the page buffer 1215, and the column decoder 1213 may decode the column address signal and may transfer the decoded column address signal to the NAND cell array 1230 through the plurality of bit lines BL. The signal of the NAND cell array 1230 may be transferred to the sense amplifier 1214 through the column decoder 1213. The sense amplifier 1214 may amplify the signal and may transfer the amplified signal to the control logic 1212 through the page buffer 1215.

The NAND cell array 1230 may be a three-dimensional (3D) memory array that includes three-dimensionally arranged memory cells, a plurality of word lines electrically connected to the memory cells, and a plurality of bit lines electrically connected to the memory cells. The 3D memory array may be monolithically formed on a substrate (e.g., semiconductor substrate such as silicon, or semiconductor-on-insulator substrate). The 3D memory array may include vertical NAND strings that are vertically oriented such that at least one memory cell is located over another memory cell. The at least one memory cell may comprise a charge trap layer. The following patent documents, which are hereby incorporated by reference in their entirety, describe suitable configurations for three-dimensional memory arrays, in which the three-dimensional memory array is configured as a plurality of levels, with word lines and/or bit lines shared between levels: U.S. Pat. Nos. 7,679,133; 8,553,466; 8,654,587; 8,559,235; and US Pat. Pub. No. 2011/0233648.

While some example embodiments of inventive concepts have been particularly shown and described, it will be understood that various changes in form and details may be made therein without departing from the spirit and scope of the following claims.

What is claimed is:

1. A method of manufacturing a semiconductor device, the method comprising:
   forming an insulating pattern layer on a substrate;
   conformally forming a first conductive layer on the insulating pattern layer, the first conductive layer having a first thickness;
   wet etching the first conductive layer, the wet etching the first conductive layer including reducing a thickness of the first conductive layer from the first thickness to a second thickness that is less than the first thickness; and
   forming a second conductive layer on the first conductive layer after the wet etching the first conductive layer, the second conductive layer including a material that is different from a material included in the first conductive layer, wherein
   the forming the second conductive layer includes forming a first thin film layer between the first conductive layer and the second conductive layer.

2. The method of claim 1, wherein the forming the first thin film layer includes forming the first thin film layer as an intermetallic compound by a chemical reaction of a chemical element in the first conductive layer and a chemical element in the second conductive layer.

3. The method of claim 1, wherein the wet etching the first conductive layer includes wet etching the first conductive layer such that the second thickness is less than half of the first thickness.

4. The method of claim 1, wherein the wet etching the first conductive layer includes wet etching the first conductive layer such that the second thickness ranges from about 5 Å to about 20 Å.

5. The method of claim 1, wherein the wet etching the first conductive layer includes using an etchant, the etchant includes one of a SC1 etchant, sulfuric acid, phosphoric acid, acetic acid, and nitric acid, or a combination thereof.

6. The method of claim 5, wherein the wet etching the first conductive layer includes etching the first conductive layer with an etching rate ranging from about 1 Å to about 10 Å per minute.

7. The method of claim 1, wherein the forming the first conductive layer includes forming the first conductive layer to include one of TiN, TiON, WN, TaN, AlN, and MoON, or a combination thereof.

8. The method of claim 1, wherein the forming the second conductive layer includes forming the second conductive layer to include one of W, Ti, Al, Co, Cu, Ta, WSi, TiSi, TaSi, and CoSi, or a combination thereof.

9. The method of claim 1, wherein, the forming the first conductive layer and the second conductive layer include performing a chemical vapor deposition (CVD) process, an atomic layer deposition (ALD) process, or an electroplating process.

10. A method of manufacturing a semiconductor device, the method comprising:
    forming a semiconductor structure on a substrate, the semiconductor structure extending vertically from an upper surface of a first area of the substrate;
    conformally forming a gate dielectric layer along a side wall of the semiconductor structure;
    conformally forming A gate electrode layer on the gate dielectric layer, the gate electrode layer having a first thickness;
    wet etching the gate electrode layer, the wet etching the gate electrode layer including reducing a thickness of the gate electrode layer to a second thickness that is less than half of the first thickness;
    forming a gate conductive layer on the gate electrode layer after the wet etching the gate electrode layer, the gate conductive layer including a material that is different from a material included in the gate electrode layer; and
    forming a contact electrode on an upper surface of a second area of the substrate, the contact electrode extending vertically extending from the upper surface of the second area of the substrate, wherein
    the forming the gate conductive layer includes forming an amorphous thin film layer between the gate electrode layer and the gate conductive layer.

11. The method of claim 10, wherein
    the wet etching of the gate electrode layer includes using an etchant to etch the gate electrode layer at an etching rate ranging from about 1 Å to about 10 Å per minute, and
    the etchant includes one of a SC1 etchant, sulfuric acid, phosphoric acid, acetic acid, and nitric acid, or a combination, thereof.

12. The method of claim 10, wherein the forming the contact electrode includes:
    forming a barrier metal layer with a third thickness on the substrate;
    wet etching the barrier metal layer to reduce a thickness of the barrier metal layer to a desired fourth thickness that is less than the third thickness; and
    forming a contact electrode layer on the barrier metal layer after the wet etching the barrier metal layer, the contact electrode layer including a material different from a material in the barrier metal layer.

13. The method of claim 10, further comprising:
    after the forming of the gate conductive layer, forming a plurality of memory cell strings that are vertically arranged on the upper surface of the substrate, wherein the plurality of memory cell strings are 3-dimensional memory strings, and the plurality of memory cell strings use the semiconductor structure as an active area.

14. A method of manufacturing a semiconductor device, the method comprising:
    forming a first conductive layer on a preliminary structure, the forming the first conductive layer including conformally forming the first conductive layer in an opening defined by the preliminary structure on a substrate, the first conductive layer having a first thickness;
    wet etching the first conductive layer, the wet etching the first conductive layer including reducing a thickness of the first conductive layer from the first thickness to a second thickness that is less than the first thickness;
    forming a second conductive layer on the first conductive layer after the wet etching the first conductive layer, the second conductive layer including a material that is different from a material included in the first conductive layer; and
    forming a first thin film layer between the first conducive layer and the second conductive layer.

15. The method of claim 14, further comprising:

forming the preliminary structure on the substrate before forming the first conductive layer on the preliminary structure, wherein the forming the preliminary structure includes forming an insulating pattern on the substrate, the insulating pattern defines the opening defined by the preliminary structure, and the second thickness is less than or equal to about half of the first thickness.

16. The method of claim 14, wherein the forming the preliminary structure includes forming a plurality of insulating layers on the substrate and a plurality of semiconductor structures extending through the plurality of insulating layers in a direction vertical to a top surface of the substrate, the plurality of insulating layers are spaced apart from each other and extend in a direction vertical to a top surface of the substrate, the opening defined by the preliminary structure is defined by portions of the plurality of semiconductor structures exposed by the plurality of insulating layers that are along a sidewall of the plurality of semiconductor structures, the forming the preliminary structure further includes forming a gate dielectric layer that partially fills the opening, and the forming the first conductive layer on the preliminary structure includes forming the first conductive layer to conformally cover the gate dielectric layer in the opening.

17. The method of claim 14, wherein the forming the first conductive layer includes forming the first conductive layer to include one of TiN, TiON, WN, TaN, AlN, and MoON, or a combination thereof, and the forming the second conductive layer includes forming the second conductive layer to include one of W, Ti, Al, Co, Cu, Ta, WSi, TiSi, TaSi, and CoSi, or a combination thereof.

* * * * *